US006649324B1

(12) United States Patent
Fiebag et al.

(10) Patent No.: US 6,649,324 B1
(45) Date of Patent: Nov. 18, 2003

(54) AQUEOUS DEVELOPER FOR LITHOGRAPHIC PRINTING PLATES

(75) Inventors: Ulrich Fiebag, Nienstadt (DE); Celin Savariar-Hauck, Badenhausen (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 172 days.

(21) Appl. No.: 09/690,254

(22) Filed: Oct. 17, 2000

Related U.S. Application Data

(63) Continuation-in-part of application No. 09/638,556, filed on Aug. 14, 2000.

(51) Int. Cl.[7] .................................................. G03F 7/32
(52) U.S. Cl. .................... 430/302; 430/273.1; 430/331; 430/348; 430/413; 430/435; 430/494
(58) Field of Search ................ 430/270.1, 271.1, 430/273.1, 302, 331, 348, 401, 406, 413, 434, 944, 945, 964, 494; 101/130, 453, 463.1, 465, 466, 467

(56) References Cited

U.S. PATENT DOCUMENTS

| 4,374,920 A | * | 2/1983 | Wanat et al. ................ 430/331 |
| 4,945,030 A | | 7/1990 | Turner et al. ............... 430/331 |
| 4,965,163 A | * | 10/1990 | Suzuki et al. ............... 430/114 |
| 5,035,982 A | | 7/1991 | Walls ........................ 430/331 |
| 5,126,229 A | | 6/1992 | Akiyama et al. ........... 430/302 |
| 5,380,623 A | | 1/1995 | Miller et al. ................ 430/331 |
| 5,466,559 A | | 11/1995 | Miller et al. ................ 430/331 |
| 5,766,826 A | | 6/1998 | Miller et al. ................ 430/331 |
| 6,060,218 A | | 5/2000 | Van Damme et al. ...... 430/302 |
| 6,083,662 A | | 7/2000 | Miller et al. ................ 430/302 |
| 6,083,663 A | * | 7/2000 | Vermeersch et al. ........ 430/302 |
| 6,100,016 A | * | 8/2000 | Denzinger et al. .......... 430/331 |
| 6,143,479 A | | 11/2000 | Fiebag et al. ............... 430/331 |
| 6,180,322 B1 | | 1/2001 | Sakurai et al. ............. 430/321 |
| 6,280,899 B1 | * | 8/2001 | Parsons et al. .......... 430/270.1 |
| 6,294,311 B1 | * | 9/2001 | Shimazu et al. ......... 430/271.1 |
| 6,352,811 B1 | * | 3/2002 | Patel et al. ............... 430/270.1 |
| 6,352,812 B1 | * | 3/2002 | Shimazu et al. ......... 430/273.1 |
| 6,358,669 B1 | * | 3/2002 | Savariar-Hauck et al. ........................ 430/273.1 |
| 6,458,511 B1 | * | 10/2002 | Wittig et al. ................ 430/302 |
| 6,461,795 B1 | * | 10/2002 | McCullough et al. ....... 430/302 |
| 6,509,132 B1 | * | 1/2003 | Oohashi et al. .......... 430/270.1 |
| 2001/0044065 A1 | * | 11/2001 | Hauck et al. ................ 430/166 |
| 2003/0036024 A1 | * | 2/2003 | Fiebag et al. ............... 430/331 |

FOREIGN PATENT DOCUMENTS

| EP | 397 407 A2 | * | 11/1990 | ............ B41N/3/08 |
| EP | 0908304 | | 4/1999 | |
| EP | 0908305 | | 4/1999 | |
| EP | 0908307 | | 4/1999 | |
| EP | 0 908 785 A2 | | 4/1999 | |
| EP | 0943451 | | 9/1999 | |
| EP | 0 950 513 A1 | | 10/1999 | |
| EP | 0 953 880 A2 | | 11/1999 | |
| WO | WO 99/11458 | * | 3/1999 | ............ B41C/1/10 |
| WO | WO 99/21725 | * | 5/1999 | ............ B41M/5/36 |
| WO | 99/67097 | | 12/1999 | |
| WO | WO 99/67097 | * | 12/1999 | |
| WO | WO 01/96119 A1 | * | 12/2001 | ............ B41C/1/10 |
| WO | 02/14071 A1 | | 2/2002 | |

OTHER PUBLICATIONS

Grant, Julius, ed. Hackh's Chemical Dictionary. 3rd ed. New York: McGraw–Hill Book Company, Inc., 1944. p. 305.*

* cited by examiner

*Primary Examiner*—Janet Baxter
*Assistant Examiner*—Barbara Gilliam
(74) *Attorney, Agent, or Firm*—RatnerPrestia

(57) ABSTRACT

An aqueous developer for lithographic printing plates and a method for developing the printing plates are disclosed. The developer comprises an organic dispersing agent. The developer develops multi-layer printing plates quickly, with high throughput, but with no sludge formation in the developing process.

19 Claims, No Drawings

AQUEOUS DEVELOPER FOR LITHOGRAPHIC PRINTING PLATES

CROSS-REFERENCE TO RELATED APPLICATIONS

This application is a continuation-in-part of U.S. patent application Ser. No. 09/638,556, filed Aug. 14, 2000, incorporated herein by reference.

FIELD OF THE INVENTION

This invention relates to lithographic printing. In particular, this invention relates an aqueous developer for multi-layered lithographic printing plates.

BACKGROUND OF THE INVENTION

In lithographic printing, ink receptive areas, known as image areas, are generated on a hydrophilic surface. When the surface is moistened with water and ink is applied, the hydrophilic regions retain the water and repel the ink, and the ink receptive areas accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Lithographic printing plate precursors, often called printing plates or printing forms, typically comprise a radiation-sensitive coating applied over the hydrophilic surface of a support. If after exposure to radiation the exposed regions of the coating are removed in the developing process revealing the underlying hydrophilic surface of the support, the plate is called a positive-working printing plate. Conversely, if the unexposed regions are removed by the developing process, the plate is called a negative-working plate. In each instance, the regions of the radiation-sensitive layer (i.e., the image areas) that remain are ink-receptive, and the regions of the hydrophilic surface revealed by the developing process accept water and aqueous solutions, typically a fountain solution, and repel ink.

Direct digital imaging of offset printing plates, which obviates the need for exposure through a negative, is becoming more important in the printing industry. Multi-layer lithographic printing plates comprise a top layer and an underlayer on a substrate with a hydrophilic surface. After exposure to radiation, the exposed regions of the printing plate are removed during the developing process, revealing the underlying hydrophilic surface of the support.

Typically, the underlayer of these systems is soluble in the developer, but the top layer is only dispersible in the developer. The material generated by removal of the top layer in the exposed regions builds up in the developer. This material can coagulate and redeposit as sludge on the rollers of the processor and the on the walls and bottom of the developer tank. Sludge formation can severely limit developer throughput (i.e., the area of exposed printing plates developed, in $m^2$, per liter of developer).

Thus, a need exists for a developer for multi-layered lithographic printing plates that develops multi-layer printing plates quickly, with high throughput, but with no sludge formation in the developing process.

SUMMARY OF THE INVENTION

In one embodiment, the invention is a method of developing an exposed multi-layer imageable element. The method comprises the steps of:
(A) providing an imagewise exposed imageable element comprising exposed and unexposed regions,
in which:
the imageable element comprises, in order:
a top layer;
an underlayer; and
a hydrophilic substrate;
the underlayer comprises a polymeric material that is soluble or dispersible in a developer;
the top layer comprises a polymeric material that is dispersible in the developer; and
the top layer is ink-receptive;
(B) applying the developer to the imagewise exposed imageable element, removing the exposed regions of the imageable element, and forming the image;
in which:
the developer comprises water and a dispersing agent or a mixture of dispersing agents; and
the developer has a pH of about 7 to about 11.

In another embodiment, the invention is a composition useful as a developer for multi-layered lithographic printing plates. The composition comprises:
water;
a dispersing agent or a mixture of dispersing agents;
a buffer; and
an organic solvent or a mixture of organic solvents;
in which the composition has a pH of about 7 to about 11.

DETAILED DESCRIPTION OF THE INVENTION

Multi-layer, heat-sensitive imageable elements for the preparation of positive-working lithographic printing plates comprise at least two layers, an underlayer and a top layer, on a substrate with a hydrophilic surface. The underlayer is over the hydrophilic surface of the substrate, and the top layer over the underlayer. These systems are disclosed in, for example, in U.S. patent application Ser. No. 09/301,866 [WO 99/67097] and EP 864,420, incorporated herein by reference. Other layers, such as radiation absorbing layers may also be present in the heat-sensitive imageable element. The back side of the substrate (i.e., the side opposite the underlayer and top layer) may be coated with an antistatic agent and/or a slipping layer or matte layer to improve handling and "feel" of the imageable element.

The substrate may consist only of a support, or it may additionally comprise one or more optional subbing and/or adhesion layers. The support is of sufficient thickness to sustain the wear from printing and is thin enough to wrap around a printing form. Polyethylene terephthalate or polyethylene naphthanate, typically has a thickness of from about 100 to about 310 $\mu$m, preferably about 175 $\mu$m. Aluminum sheet typically has a thickness of from about 100 to about 600 $\mu$m. Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the support and the composition of subsequent coated layers. Examples of subbing layer materials are adhesion promoting materials, such as alkoxysilanes, aminopropyltriethoxysilane, glycidoxypropyltriethoxysilane and epoxy functional polymers, as well as conventional subbing materials used on polyester bases in photographic films.

The underlayer comprises a polymeric material that is dispersible or, preferably, soluble in the developer, and insoluble in the solvent used to coat the top layer so that the top layer can be coated over the underlayer without dissolving the underlayer. These polymeric materials include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof.

Solvent resistant underlayers have been developed to provide improved chemical resistance, i.e., resistance to both fountain solution and to aggressive washes. Polymeric materials useful in solvent resistant underlayers include: polyvinylacetals; copolymers that comprise N-substituted maleimides, especially N-phenylmaleimide, methacrylamides, especially methacylamide, and acrylic and/or methacrylic acid, especially methacrylic acid; aqueous alkaline developer soluble copolymers that comprise a monomer that has a urea bond in its side chain (i.e., a pendent urea group), such are disclosed in Ishizuka, U.S. Pat. No. 5,731,127; and alkaline developer soluble polymeric materials that comprise a pendent sulfonamide group, such as are disclosed in Aoshima, U.S. Pat. No. 5,141,838. Negative-working, base-soluble or dispersible photosensitive compositions, such as are disclosed in described in Baumann, U.S. Pat. No. 5,700,619, and in *Photopolymers: Radiation Curable Imaging Systems*, B. M. Monroe in *Radiation Curing: Science and Technology*, S. P. Pappas, Ed., Plenum, N.Y., 1992, pp. 399–440, may be used to produce a solvent resistant underlayer.

The top layer becomes soluble or dispersible in the developer following thermal exposure. It comprises a polymeric material that is ink-receptive and insoluble in the aqueous solution, such as acrylic and methacrylic polymers and copolymers, such as polymethyl methacrylate; polystyrene; styrene-acrylic copolymers; polyesters; polyamides; polyureas; polyurethanes; nitrocellulosic polymers; epoxy resins; or combinations thereof. Polymers that contain phenolic hydroxyl groups, such as novolac resins, resol resins, acrylic resins that contain pendent phenol groups, and polyvinyl phenol resins may be used in the top layer, either alone or in conjunction with a solubility-suppressing component.

A compound that functions as solubility-suppressing component for hydroxy-containing polymeric materials may be present in the top layer. Solubility-suppressing components have polar functional groups that are believed, to act as acceptor sites for hydrogen bonding with the hydroxyl groups. Useful polar groups include, for example, diazo groups; diazonium groups; keto groups; sulfonic acid ester groups; phosphate esters groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds containing other polar groups, such as ether, amine, azo, nitro, ferrocenium, sulfoxide, sulfone, and disulfone may also be useful as solubility-suppressing components. These systems are disclosed, for example in West, U.S. Pat. Nos. 5,705,308 and 6,060,222; Bennett, WO97/07986 [PCT/GB96/01973]; and Nagasaka, EP 0,823,327; all of which are incorporated herein by reference.

If the printing plate is to be exposed with infrared radiation, one or both layers typically comprise an infrared absorber, known as a photothermal conversion material. An additional infrared absorbing layer that comprises a photothermal conversion material may also be present either between the substrate and the underlayer or between the underlayer and the top layer. Photothermal conversion materials include dyes and pigments, such as a dyes and pigments of the squarylium, merocyanine, indolizine, pyrilium and metal diothiolene classes, as well as carbon black. Dyes, especially dyes that are soluble in the developer, are preferred. The dye may be chosen, for example, from indoaniline dyes, oxonol dyes, porphyrin derivatives, anthraquinone dyes, merostyryl dyes, pyrylium compounds and sqarylium derivatives.

These multi-layer, thermally imageable element may be imaged with a laser or an array of lasers emitting modulated near infrared or infrared radiation in a wavelength region that is absorbed by the element. Infrared radiation, especially infrared radiation in the range of about 800 nm to about 1200 nm, is typically used for imaging a thermally imageable element. Imaging is conveniently carried out with a laser emitting at about 830 nm or at about 1056 nm. Suitable commercially available imaging devices include image setters such as a Creo Trendsetter (available from the CREO Corp., British Columbia, Canada) and a Gerber Crescent 42T (available from the Gerber Corp.).

Alternatively, the multi-layer, thermally imageable element may be imaged using a conventional apparatus containing a thermal printing head. An imaging, apparatus suitable for use in conjunction with the imageable elements includes at least one thermal head but would usually include a thermal head array, such as a TDK Model No. LV5416 used in thermal fax machines and sublimation printers.

After exposure, the exposed regions (i.e., the thermally imaged regions) of the top layer and the underlayer are removed by a developer, revealing the hydrophilic surface of the substrate. The top layer is ink-receptive, but the exposed regions of the hydrophilic surface accept water and aqueous solutions, typically a fountain solution, and repel ink.

It has been proposed that in these systems thermal exposure changes the adhesion of the top layer to the layer to which it is adhered, typically the underlayer. After imagewise thermal exposure, the developer can penetrate the exposed regions of the top layer much more rapidly than it penetrates the unexposed regions. The developing process is carried for a long enough time to remove the exposed regions of the top layer and the underlying regions of the underlayer, but not long enough to remove the unexposed regions of the top layer. The underlying regions of the underlayer are removed along with the top layer, without substantially affecting the top layer and underlayer in the unexposed region, revealing the hydrophilic surface of the substrate. Thus, the system is positive working.

Typically, only the underlayer is dissolved in the developer. The top layer is not soluble and is dispersed, rather than dissolved, in the developer. As more exposed printing plates are passed through the developer bath, the amount of material dispersed in the developer increases. Eventually, this material coagulates and deposits as sludge on the rollers of the processor and the on the walls and bottom of the developer tank. Sludge formation can severely limit developer throughput (i.e., the area of exposed printing plates developed, in $m^2$, per liter of developer). The rollers transfer the sludge to both the image and non-image regions of the plate during development, adversely affecting the image produced by the printing plate.

It has been found that a developer comprising a dispersing agent develops multi-layer printing plates quickly, with high throughput, but with no sludge formation in the developing process. Although the specific composition of the developer will depend on the composition of the top layer and the underlayer, useful developers typically are aqueous alkaline solutions having a pH of at least 7 to about 11. Preferred aqueous alkaline developers have a pH about 8 to about 10.5, more preferably about 9 to 10, even more preferably about 10. Preferred developers are aqueous developers, i.e., those that either do not comprise an added organic solvent or to which only a small amount of organic solvent has been added.

To prevent formation of sludge during the developing process, an organic dispersing agent of mixture of agents is added to the developer. The dispersing agent forms a stable dispersion with the component or components of the top layer. The dispersing agent keeps the dispersible components of the top layer in finely dispersed form and prevents their redeposition on the exposed and developed element and on the rollers and the processor.

Dispersing agents, also known as dispersants or dispersers, are materials that are added to solid-in-liquid suspensions to separate the individual suspended particles. They are well known in, for example, the art of pigment dispersion. Organic dispersing agents may be anionic, cationic or electro-neutral. They are added to particle dispersions to prevent the particles from coagulating, to maintain the size of the particles on standing, and to prevent the particles from floating to the surface or settling to the bottom to form sludge.

Dispersing agents differ from surfactants or surface-active agents, which reduce the surface tension of liquids or reduce the interfacial tension between two liquids of a liquid and a solid.

Typical organic dispersing agents include monofunctional oleo-alkylene oxide block copolymers, such as HYDROPALAT® 1080 dispersing agent; partially neutralized aceto-phosphonate amine salts, such as HYDROPALAT® 3204 dispersing agent: and carboxylic acid polymers, such as Sequion MS 84 dispersing agent. Typically, about 0.5 wt % to about 10.0 wt %, preferably about 1.0 wt % to about 5.0 wt %, based on the total weight of the developer, of the dispersing agent or mixture of dispersing agents is present in the developer. Many dispersing agents are supplied as mixtures that also contain a solvent or solvents, such as water. These percentages are based on the total amount of mixture or mixtures of dispersing agents added to the developer, not on the weight of active ingredient or ingredients added to the developer. Although the amount will vary with the nature of the active ingredient or ingredients added, the amount of active ingredient or ingredients added is typically about 0.3 wt % to about 8.0 wt %, preferably about 0.5 wt % to about 4.0 wt %, based on the total weight of the developer.

Water typically comprises about 75 wt % to about 98 wt % of the developer, based on the weight of the developer; preferably about 80 wt % to 95 wt % of the developer, based on the weight of the developer; and more preferably about 85 wt % to 92 wt % of the developer, based on the weight of the developer.

The developer may also comprise a buffer system to keep the pH relatively constant in the desired pH range. Numerous buffer systems are known to those skilled in the art. Typically buffer systems include, for example: combinations of water-soluble amines, such as mono-ethanol amine, di-ethanol amine, tri-ethanol amine, or tri-i-propyl amine, with a sulfonic acid, such as benzene sulfonic acid or 4-toluene sulfonic acid; mixtures of the tetra sodium salt of ethylene diamine tetracetic acid (EDTA) and EDTA; mixtures of phosphate salts, such as mixtures of mono-alkali phosphate salts with tri-alkali phosphate salts; and mixtures of alkali borates and boric acid.

The developer may also comprise an organic solvent or a mixture of organic solvents. The organic solvent or mixture of organic solvents must be misable with water, or at least soluble in the developer to the extent it is added to the developer, so that phase separation between an aqueous phase and a phase containing the organic solvents does not occur. The following solvents and mixtures of these solvents are suitable for use in the developer: the reaction products of phenol with ethylene oxide and propylene oxide, such as ethylene glycol phenyl ether; benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethylethanol and 2-butoxyethanol. A single organic solvent or a mixture of organic solvents can be used. The organic solvent or solvent mixture is typically present in the developer at a concentration of between about 0.5 wt % to about 15 wt %, preferably about 1 wt % to about 10 wt %, more preferably about 1 wt % to about 6 wt %, and even more preferably between about 3 wt % and about 5 wt %, based on the weight of the developer.

The developer may also comprise a surfactant or wetting agent. Preferred surfactants include: alkali metal salts of alkyl naphthalene sulfonates; alkali metal salts of the sulfate monoesters of aliphatic alcohols, typically having six to nine, carbon atoms, such as sodium octyl sulfate; and alkali metal sulfonates, typically having six to nine carbon atoms. A preferred alkali metal is sodium. The developer typically comprises 1 to 10 wt %, preferably about 1 to 6 wt %, based on the weight of the developer, of the surfactant. As is well known to those skilled in the art, many surfactants are supplied as aqueous surfactant solutions. These percentages are based on the amount of surfactant (i.e. the amount of active ingredient or ingredients exclusive of water and other inactive materials in the surfactant solution) in the developer.

INDUSTRIAL APPLICABILITY

The developer can be used to develop printing plates, especially multi-layer thermal printing plates in which the top layer is dispersible in the developer. The developer develops multi-layer printing plates, especially two-layer printing plates, quickly, with high throughput, but with no sludge formation in the developing process.

Typically, the developer is applied to the imaged element by rubbing or wiping the top layer with an applicator containing the developer. Alternatively, the imaged element may be brushed with the developer or the developer may be applied to the element by spraying the top layer with sufficient force to remove the exposed regions. In either instance, a developed element is produced. The developing process may be conveniently carried out in a commercial processor, such as the Mercury CTP Processor (Kodak Polychrome Graphics), the Sprinter 72 Processor (Kodak Polychrome Graphics) or the Unigraph PC28E Processor (Unigraph). During the development process, the exposed regions of both the underlayer and the upper layer are removed, revealing the underlying hydrophilic substrate. The developed element, typically a lithographic printing plate or printing member, comprises (1) regions in which the underlayer and top layer have been removed revealing the underlying surface of the hydrophilic substrate, and (2) complimentary regions in which the underlayer and top layer have not been removed. The regions in which both the underlayer and top layer have not been removed are ink receptive and correspond to the regions that were not exposed during imaging.

If the underlayer comprises a negative-working base-soluble or dispersible photosensitive composition, the developed element is exposed to actinic radiation, i.e., any radiation that can induce photoinsolubilization in the underlayer. Radiation sources are well known to those skilled in the art and include, for example, lasers, fluorescent lamps, mercury, metal additive and arc lamps.

Once the imageable element has been imaged and developed, printing can then be carried out by applying a fountain solution and then a lithographic ink to the image on its surface. The fountain solution is taken up by the imaged regions and the ink is taken up by the unimaged regions. The ink is then transferred to a suitable receiving material (such as cloth, paper, metal, glass, or plastic) either directly or indirectly through the use of an offset printing blanket to provide a desired impression of the image thereon. The imaging members can be cleaned between impressions, if desired, using conventional cleaning means.

The advantageous properties of this invention can be observed by reference to the following examples, which illustrate but do not limit the invention.

EXAMPLES

A novolac resin (Novolac SPN 400) (2.48 g) was dissolved in 30 mL of a mixture of toluene and DOWANOL® PM solvent (70:30) and coated over the underlayer to give a top layer coating weight of 0.5 g/m². The resulting thermally imageable printing plate was dried at 90° C. for 10 min. The plate was imaged with a Creo 3244 Trendsetter at 8 W and 140 rpm.

A developer containing the following components was prepared: 85 wt % water, 1 wt % HYDROPALAT® 3204

| Glossary | |
| --- | --- |
| Copolymer 1 | Copolymer of N-phenylmaleimide, methacrylamide, and methacrylic acid (45:35:20 mol %) |
| DOWANOL ® EPh | Ethylene glycol phenyl ether (Dow Chemical, Midland, MI USA) |
| DOWANOL ® PM | Propylene glycol methyl ether (Dow Chemical, Midland, MI USA) |
| HYDROPALAT ® 1080 | Dispersing agent, monofunctional oleo-alkylene oxide block copolymer (80% active ingredient) (Henkel, Dusseldorf, Germany) |
| HYDROPALAT ® 3204 | Dispersing agent, partially neutralized acetophosphonate amine salt (48–52% active ingredient) (Henkel, Dusseldorf, Germany) |
| Nega 107 | Negative diazo resin derived from condensation of 3-methoxy-diphenylamine-4-diazonium sulfate and 4,4'-bis-methoxymethyldiphenylether, isolated as mesitylene sulfonate salt (Panchim, Lisses, France) |
| Novolac SPN 400 | Novolac resin (Clariant, Wiesbaden, Germany) |
| Petro AA | Sodium naphthalene sulfonate (Witco) |
| PD 140 | Novolac resin (Borden Chemical, Columbus, OH USA) |
| PMP234 | Copolymer (40:50:10 wt %) of APK-234, acrylonitrile, and methacrylamide; APK-234 is a urea substituted monomer of the following structure: $CH_2=C(CH_3)-CO_2-CH_2CH_2-NH-CO-NH-p-C_6H_4-OH$ |
| Sequion MS 84 | Carboxylic acid polymer (Polygon Chemie AG) |
| TEXAPON ® CPS | Sodium alkyl sulfate (Henkel) |
| TRILON ® B chelating agent | Tetra sodium ethylenediamine tetraacetic acid (BASF, Ludwigshafen, Germany) |
| TRILON ® BS chelating agent | Ethylenediamine tetraacetic acid (BASF, Ludwigshafen, Germany) |
| Trump IR Dye | Infrared absorbing dye ($\lambda_{max}$ = 830 nm) (Eastman Kodak, Rochester, NY, USA) |

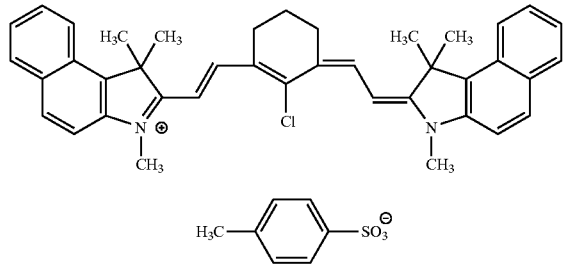

Trump IR Dye

Example 1

A coating solution was prepared by dissolving 2.13 g of a carboxy-functional polyvinylacetal prepared from maleic anhydride, 2-(N-methylamino)-acetaldehyde dimethyl acetal, and polyvinyl alcohol following the procedure of Preparation Example 11 of Baumann, U.S. Pat. No. 5,700,619; 2.13 g of Nega 107 negative diazo resin; and 0.15 g of Trump IR Dye in 50 mL of 2-methyoxyethanol, methanol, and 2-butanone (35:25:40).

The solution was coated onto a substrate to give a photosensitive (ultraviolet sensitive) underlayer having a coating weight of 1.40 g/m². The substrate was an aluminum sheet that had been electrochemically grained, anodized, and coated with polyvinyl phosphonic acid.

dispersing agent, 2.6 wt % sodium alkyl sulfate, 5.3 wt % sodium naphthalene sulfonate, 1.2 wt % diethanol amine, 4.0 wt % DOWANOL® EPh solvent, and 1 wt % of a buffer prepared by mixing one part of TRILON® BS and twenty parts of TRILON® B. The developer had a pH of about 10. The exposed printing plate was developed in this developer at 24° C. in a Unigraph PC 28E processor at 80 cm/min giving a dwell time of 18 s. The developed printing plate showed clean development with good resolution.

Example 2

A coating solution was prepared by dissolving 3.0 g of copolymer 1, 1.5 g of PMP234, and 0.7 g Trump IR dye in 50 mL of a mixture of methanol, dioxolane, methyl lactate, and dimethylformamide (43:43:7:7). The solution was coated onto the substrate of Example 1 to give an underlayer having a coating weight of 2.0 g/m$^2$.

A novolac resin (PD 140) was tosylated to 3.0 mol %. The tosylated resin (2.5 g) was dissolved in a mixture of butyl acetate and n-butanol (90:10) and coated over the previous layer to give a top layer coating weight of 0.5 g/m$^2$. The resulting thermally imageable printing plate was dried at 90° C. for 10 min. The printing plate was imaged with a Creo 3244 Trendsetter at 8 W and 140 rpm.

The exposed plates were developed with a developer consisting of 79% of the developer of Example 1, 20% Developer 4005, a positive developer for conventional plates (Kodak Polychrome Graphics), and 1% HYDROPALAT® 1080 dispersing agent. The plates showed clean development with good resolution.

Example 3

Developer Preparation

The following developers were prepared:

Comparison Developer—87.88% water, 5.3% TEXAPON® CPS, 1.2% Petro AA, 0.12% diethanol amine, 4.5% toluene sulfonic acid, and 1% DOWANOL® PM solvent. The pH of the developer was between 9.5 and 10.5.

Developer 1—85.28% water, 2.6% HYDROPALAT® 3204 dispersing agent, 5.3% TEXAPON® CPS, 1.2% Petro AA, 1.2% diethanol amine, 0.12% 4-toluene sulfonic acid, and 1% DOWANOL® PM solvent. The pH of the developer was between 9.5 and 10.5.

Developer 2—83.28% water, 2% HYDROPALAT® 3204 dispersing agent, 2.6% TEXAPON® CPS, 5.3% Petro AA, 1.2% diethanol amine, 0.12% toluene sulfonic acid, 4.5% DOWANOL® PM solvent, and 1% of the buffer prepared in Example 1. The pH of the developer was between 9.5 and 10.5.

Developer 3—83.28% water, 2% HYDROPALAT® 1080 dispersing agent, 2.6% TEXAPON® CPS, 5.3% Petro AA, 1.2% diethanol amine, 0.12% toluene sulfonic acid, 4.5% DOWANOL® PM solvent, and 1% of the buffer prepared in Example 1. The pH of the developer was between 9.5 and 10.5.

Developer 4—82.28% water, 1% Sequion MS 84, 1% HYDROPALAT® 1080 dispersing agent, 1% HYDROPALAT® 3204 dispersing agent, 2.6% TEXAPON® CPS, 5.3% Petro AA, 1.2% diethanol amine, 0.12% toluene sulfonic acid, 4.5% DOWANOL® PM solvent, and 1% of the buffer prepared in Example 1. The pH of the developer was between 9.5 and 10.5.

Developer 5—83.28% water, 1% HYDROPALAT® 1080 dispersing agent, 1% HYDROPALAT® 3204 dispersing agent, 2.6% TEXAPON® CPS, 5.3% Petro AA, 1.2% diethanol amine, 0.12% toluene sulfonic acid, 4.5% DOWANOL® PM solvent, and 1% of the buffer prepared in Example 1. The pH of the developer was between, 9.5 and 10.5.

Developer 6—1% HYDROPALAT® 1080 dispersing agent, 2% HYDROPALAT® 3204 dispersing agent, and 97% of the developer of Example 1 of EP 0 482 098 [Walls, U.S. Pat. No. 5,035,982]. The pH of the developer was 7.4.

Developer 7—2% HYDROPALAT® 3204 dispersing agent, and 98% of the developer of Example 1 of EP 0 602 736 [Miller, U.S. Pat. No. 5,466,559]. The pH of the developer was 9.5.

Developer 8—1% HYDROPALAT® 1080 dispersing agent, 1% HYDROPALAT® 3204 dispersing agent, and 98% of the developer of Example 1 of DE 3,913,183 [Akiyama U.S. Pat. No. 5,126,229]. The pH of the developer was 10.5.

Developer Evaluation

The developers were evaluated by the following procedure. Conventional negative working diazo plates (WINNER® printing plates, Kodak Polychrome Graphics, Osterode, Germany) were contact exposed with ultraviolet radiation through a negative having a UGRA step wedge. The multi-layer infrared imageable printing plates described in Example 1 and Example 2 were imaged with a Creo 3244 Trendsetter at 9.5 W and 185 rpm. The infrared imageable printing plates were imaged to produce an UGRA digital scale image.

A Mercury CTP processor was filled with 40 L of developer. During the loading tests, the developer was topped with 30 mL of developer per m$^2$ of developed plates. The processing speed was 1 m/min giving a dwell time of 25 sec. The developer temperature was 23° C.

TABLE 1

Evaluation of Developer 1

| Loading$^a$ | Diazo Plate$^b$ | IR Sensitive Printing Plate$^c$ |
|---|---|---|
| 1 m$^2$/L | No sludge | No sludge |
| 5 m$^2$/L | No sludge | Some precipitate sticking to rollers |
| 10 m$^2$/L | No sludge | Rollers dirty |
| 15 m$^2$/L | No sludge | End of life of developer |
| 20 m$^2$/L | No sludge | End of life of developer |

$^a$Area of exposed plates developed in the developer.
$^b$WINNER ® printing plates.
$^b$Infrared imageable printing plates of Example 1.

After a loading of only about 3 m$^2$/L of the photosensitive printing plate of Example 1, Developer 1 showed the first signs of deposition. The novolac resin coagulated and redeposited on the plates. After a loading of about 10 m$^2$/L, the developer was so contaminated by sludge that clean development could not be attained. The sludge could not be redispersed by circulating the developer. To clean the processor the sludge had to be scraped from the walls and bottom of the developer tank. The rollers were also contaminated by sludge.

TABLE 2

Evaluation of Developers 2–8

| Loading$^a$ | Diazo Plate$^b$ | IR Sensitive printing plate$^c$ |
|---|---|---|
| 1 m$^2$/L | No sludge, developer still good | No sludge, developer still good |
| 5 m$^2$/L | No sludge, developer still good | No sludge, developer still good |
| 10 m$^2$/L | No sludge, developer still good | No sludge, developer still good |
| 15 m$^2$/L | No sludge, developer still good | No sludge, developer still good |
| 20 m$^2$/L | No sludge, developer still good | No sludge, developer still good |

$^a$Area of exposed plates developed in the developer.
$^b$WINNER ® printing plates.
$^b$Infrared imageable printing plates of Example 1.

Both types of plates developed well in these developers. The printing plate of Example 1 showed good development up to a loading of about 20 m$^2$/L. The phenolic resins were kept in a fine dispersed form. There was no coagulation and good circulation of the developer was possible. Although the particles settled to the bottom when the developer was allowed to stand overnight, this did not interfere with the development process. At he end of the evaluation, each developer could be drained off easily, and the processor could be rinsed with water. No scrubbing or other mechanical action was necessary to remove the deposits from the bottom of the tank. The rollers were clean throughout the entire evaluation.

Example 4

Developer Preparation

The following developers were prepared:

Developer 9—80% Developer 1 and 20% Developer 4005 (commercial developer from Kodak Polychrome Graphics). The pH of the developer was between 12.0 and 12.5.

Developer 10—78% Developer 1, 20% Developer 4005, 1% HYDROPALAT® 1080 dispersing agent, and HYDOPALAT® 3204 dispersing agent. The pH of the developer was between 12.0 and 12.5.

Developer 11—8% Developer 1, 20% Developer 4005, and Sequion MS 84 dispersing agent. The pH of the developer was between 12.0 and 12.5.

Developer 12—86% Developer 1, 12% Developer 4005, 1% HYDROPALAT® 1080 dispersing agent, and HYDOPALAT® 3204 dispersing agent. The pH of the developer was between 12.0 and 12.5.

Developer 13—88% Developer 1 and 12% Developer 4005. The pH of the developer was between 12.0 and 12.5.

Developer 14—Goldstar DC (commercial developer from Kodak Polychrome Graphics according to EP 0 274 044 [Turner, U.S. Pat. No. 4,945,030]). The pH of the developer was 13.4.

Developer 15—10% aqueous sodium metasilicate. The pH of the developer was between 13.7.

The developers were evaluated by a procedure to that used in Example 3. With Developers 9, 14, and 15, each of which did not comprise an added dispersing agent, redeposition occurred at a relatively low loading. Developers 10, 11, and 12, each of which comprises an added dispersing agent, each gave results comparable to Developers 2–8.

Example 5

This example describes the preparation of Copolymer 1. Methyl glycol (1 L) was placed in a round-bottomed flask equipped with a stirrer, thermometer, nitrogen inlet and reflux condenser. Methacrylic acid (55.74 g), N-phenylmaleimide (181.48 g), and methacrylamide (77.13 g) were added and dissolved with stirring. 2,2-Azobisisobutyro-nitrile (AIBN) (0.425 g) was added and the reaction mixture heated at 60° C. with stirring for about 24 hr. Then about 5 L of methanol was added, and the precipitated co-polymer filtered, washed twice with methanol, and dried in the oven at 40° C. for 2 days.

Other polymeric materials of this type may be prepared by following this general procedure. For example, a copolymer of N-phenylmaleimide, methacrylamide, and methacrylic acid (45:35:20 mol %) may be prepared by reaction of methacrylic acid (36.12 g), N-phenylmaleimide (165.4 g), methacrylamide (62.5 g), and AIBN (3.4 g) in methyl glycol (800 mL).

If the polymerization is carried out in 1,3-dioxolane, in some cases reprecipitation can be avoided. The monomers are soluble 1,3-dioxolane, but the polymeric material is insoluble and precipitates during the reaction.

Example 6

This example describes the preparation of a tosylated novolac resin tosylated to 1.8 mol %. By appropriate modification of the amount of reactants, novolac resins with other levels of tosylation may be prepared.

Dry novolac resin (120 g) is dissolved by stirring in acetone (325 g) in a 600 mL beaker and the solution cooled to about 10° C. 4-Toluene sulfonyl chloride (3.56 g) is added over a period of about 1 min. Triethyl amine (2.09 g) is added at about 10° C. over a period of about 1 hr and the reaction mixture stirred at ≦15° C. for 1 hr. Acetic acid (1.36 9) is added at about 10° C. over about 1 min and the reaction mixture stirred for about 15 min.

A mixture of 3.0 kg of ice and 3.0 kg of water is placed in a 7.5 L breaker. Acetic acid (5 g) is added with stirring and the mixture stirred at about 15° C. for about 1 min. About 25% of the reaction mixture is added and the mixture stirred for about 20 min. The reaction mixture is allowed to settle for about 20 min and the supernatant decanted from the precipitate. Water (about 1.9 Kg) is added to the precipitate and the resulting mixture stirred for 5 min at about 15° C. The precipitate is allowed to settle for 20 min and the supernatant decanted. The process is repeated with the remaining three portions of the reaction mixture. The precipitate is collected and dried to yield about 123 g of tosylated novolac resin in which about 1.8 mol % of the hydroxyl groups have been converted to tosyl groups.

Having described the invention, we now claim the following and their equivalents.

What is claimed is:

1. A method for forming an image, the method comprising the steps of:
(A) providing an imagewise exposed imageable element comprising exposed and unexposed regions,
   in which:
      the imageable element comprises, in order:
         a top layer;
         an underlayer; and
         a hydrophilic substrate;
      the underlayer comprises a polymeric material that is soluble or dispersible in a developer;
      the top layer comprises a polymeric material that is dispersible in the developer; and
      the top layer is ink-receptive;
(B) applying the developer to the imagewise exposed imageable element, removing the exposed regions of the imageable element, and forming the image;
   in which:
      the developer comprises water and a dispersing agent;
      the developer has a pH of about 7 to about 11, and
      the dispersing agent is a partially neutralized aceto-phosphonate amine salt.

2. The method of claim 1 in which the dispersing agent comprises about 0.3 wt % to about 8.0 wt % of the developer, based on the weight of active ingredient in the dispersing agent.

3. The method of claim 1 in which the developer additionally comprises a buffer and either an organic solvent or a mixture of organic solvents.

4. The method of claim 3 in which the developer comprises about 0.5 wt % to about 15 wt % of the organic solvent or mixture of organic solvents and about 0.3 wt % to about 8.0 wt % of the dispersing agent, based on the weight of active ingredient in the dispersing agent.

5. The method of claim 4 in which the pH of the developer is about 8 to about 10.5.

6. The method of claim 5 in which the developer comprises about 1 wt % to about 10 wt % of the organic solvent or mixture of organic solvents and about 0.5 wt % to about 4 wt % of the dispersing agent, based on the weight of active ingredient in the dispersing agent.

7. The method of claim 6 in which the pH of the developer is about 9 to about 10.

8. A method for forming an image, the method comprising the steps of (A) providing an imageable element comprising, in order:
   a top layer;
   an underlayer; and
   a hydrophilic substrate;
      the underlayer comprises a polymeric material that is soluble or dispersible in a developer;
      the top layer comprises a polymeric material that is dispersible in the developer; and
      the top layer is ink-receptive;
(B) thermally exposing the imageable element and producing an imagewise exposed imageable element comprising exposed and unexposed regions;
(C) applying a developer to the imagewise exposed imageable element, removing the exposed regions of the imageable element, and forming the image
   in which:
      the developer comprises water and a dispersing agent;
      the developer has a pH of about 7 to about 11, and
      the dispersing agent is a partially neutralized aceto-phosphonate amine salt.

9. The method of claim 8 in which the dispersing agent comprises about 0.3 wt % to about 8.0 wt % of the developer, based on the weight of active ingredient in the dispersing agent.

10. The method of claim 9 in which the developer additionally comprises a buffer and either an organic solvent or a mixture of organic solvents.

11. The method of claim 10 in which the developer comprises about 0.5 wt % to about 15 wt % of the organic solvent or mixture of organic solvents and about 0.3 wt % to about 8.0 wt % of the dispersing agent, based on the weight of active ingredient in the dispersing agent.

12. The method of claim 11 in which the pH of the developer is about 8 to about 10.5.

13. The method of claim 12 in which the developer comprises about 1 wt % to about 10 wt % of the organic solvent or mixture of organic solvents and about 0.5 wt % to about 4 wt % of the dispersing agent, based on the weight of active ingredient in the dispersing agent.

14. The method of claim 13 in which the pH of the developer is about 9 to about 10.

15. A composition useful as a developer for lithographic printing plates, the composition comprising:
   water;
   an organic dispersing agent;
   a buffer; and
   an organic solvent or a mixture of organic solvents;
   in which:
      the composition has a pH of about 7 to about 11; and
      the dispersing agent is a partially neutralized aceto-phosphonate amine salt.

16. The composition of claim 15 in which the water comprises about 75 wt % to about 98 wt % of the composition; the organic solvent or mixture of organic solvents comprises about 0.5 wt % to about 15 wt % of the composition; the dispersing agent comprises about 0.3 wt % to about 8.0 wt % of the composition, based on the weight of active ingredient in the dispersing agent; and the pH of the composition is about 7.0 to about 11.0.

17. The composition of claim 16 in which the pH of the developer is about 8 to about 10.5.

18. The composition of claim 17 in which the developer comprises about 1 wt % to about 10 wt % of the organic solvent or mixture of organic solvents and about 0.5 wt % to about 4 wt % of the dispersing agent, based on the weight of active ingredient in the dispersing agent.

19. The composition of claim 18 in which the pH of the developer is about 9 to about 10.

* * * * *